(12) United States Patent
Muramatsu et al.

(10) Patent No.: US 6,777,714 B2
(45) Date of Patent: Aug. 17, 2004

(54) CRYSTALLINE SILICON SEMICONDUCTOR DEVICE AND METHOD FOR FABRICATING SAME

(75) Inventors: Shinichi Muramatsu, Tokyo (JP); Yasushi Minagawa, Tokyo (JP); Fumihito Oka, Tokyo (JP); Susumu Takahashi, Chiba (JP); Yoshiaki Yazawa, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 71 days.

(21) Appl. No.: 09/779,436

(22) Filed: Feb. 9, 2001

(65) Prior Publication Data

US 2002/0005519 A1 Jan. 17, 2002

(30) Foreign Application Priority Data

Feb. 9, 2000 (JP) ....................................... 2000-031665
May 17, 2000 (JP) ....................................... 2000-145069

(51) Int. Cl.[7] ............................................. H01L 31/036
(52) U.S. Cl. .......................................... 257/75; 257/458
(58) Field of Search ..................... 257/75, 458; 136/249, 136/258

(56) References Cited

U.S. PATENT DOCUMENTS 4,433,202 A * 2/1984 Maruyama et al. ......... 136/255
5,094,697 A * 3/1992 Takabayashi et al. ....... 136/249

FOREIGN PATENT DOCUMENTS

JP 63-182872 * 7/1988
JP 06/244104 2/1994 ........... H01L/21/20

OTHER PUBLICATIONS

IEEE First World Conference on Photovoltaic Energy Conversion, vol. II, 1994, "Thin–film Polycrystalline Si Solar Cell on Glass Substrate Fabricated by a Novel Low Temperature Process", K. Yamamoto, A. Nakahima, T. Suzuki, M. Yoshimi, H. Nishio and M. Izumina, Central Research Laboratories, pp. 1575–1578.

* cited by examiner

Primary Examiner—Sara Crane
(74) Attorney, Agent, or Firm—Antonelli, Terry, Stout & Kraus, LLP (57) ABSTRACT

Concave and convex are formed on the substrate 1, the amorphous silicon layer 4 is formed on the metallic catalyst 3 dispersed and arranged in a dotted shape in the concave portion of the concave and convex, the crystal phases 5 having respective orientations from the metallic catalyst 3 are grown, further the crystal phases 5 are integrated with each other by continuing heat treatment and the polycrystalline silicon layer 6 is formed. A crystalline silicon semiconductor device and its method for fabrication which are costly advantageous and capable of efficiently forming the polycrystalline silicon layer of a predetermined thickness needed as a semiconductor device are provided. Moreover, on the substrate 1, the polycrystalline silicon layer 30 oriented on the face (111), the metallic catalyst 40 consisted of Ni, the polycrystalline silicon layer 50 are formed in turn, further, after on which the amorphous silicon layer 60 of the predetermined thickness is formed, Ni element is diffused within the amorphous silicon layer 60 from the metallic catalyst layer 40 by performing heat treatment, and thereby crystallizing the amorphous silicon layer 60 into the polycrystalline silicon layer 60'.

9 Claims, 6 Drawing Sheets

1 SUBSTRATE

9 THIN FILM OF SiO₂
10 PINHOLE
3 METALLIC CATALYST
3a
1

FIG. 2D

4 AMORPHOUS SILICON LAYER
9
3
3a
1
10

FIG. 2E

5 CRYSTAL PHASE
4
9
10
3a
1

FIG. 2F

6 POLYCRYSTALLINE SILICON LAYER
9
3a
1

FIG. 2G

11 TRANSPARENT ELECTRODE
12 OUTPUT ELECTRODE
9
6
3a
1

FIG. 3A

1 SUBSTRATE

FIG. 3B

4 AMORPHOUS SILICON LAYER

FIG. 3C

3 METALLIC CATALYST

FIG. 3D

3
4
5 CRYSTAL PHASE

FIG. 3E

6 POLYCRYSTALLINE SILICON LAYER

FIG. 3F

14 TRANSPARENT ELECTRODE
15 OUTPUT ELECTRODE

CRYSTALLINE SILICON SEMICONDUCTOR DEVICE AND METHOD FOR FABRICATING SAME

BACKGROUND OF THE INVENTION

1. Field of the Invention

The present invention relates to a crystalline silicon semiconductor device and its method for fabrication, and particularly relates to a crystalline silicon semiconductor device having a polycrystalline silicon layer oriented entirely in an uniformed manner and a method for fabricating it or a crystalline silicon semiconductor device and its method for fabrication in which the polycrystalline silicon layers can be efficiently formed.

2. Description of the Related Art

A semiconductor device in which a polycrystalline silicon is grown on a substrate such as of glass or the like is known for a material of an electric cell preferable for a solar cell. Since this semiconductor device is not required for a large area and high quality of a silicon substrate, it allows for a large amount of cost down, however, in order to presently obtain a semiconductor device of good quality, a quartz plate of thermal resistance must be used as a substrate, therefore, it is difficult to secure a costly advantage because the quartz plate is expensive.

As a method for solving this problem, a method in which a thin film of an amorphous silicon formed on a substrate is melted and crystallized by laser annealing and a polycrystalline silicon layer is formed on it has been proposed. This method has been disclosed in K. Yamamoto et al., IEEE First World Conference on Photovoltaic Energy Conversion (1994, in Hawaii), pp. 1575–1578, and according to this, since the rise of a substrate temperature is suppressed, the description indicates that the use of a lower cost substrate is possible.

However, according to this method, since it takes a lot of time for forming a bedding crystal film and a polycrystalline silicon layer, especially the growth rate of a polycrystalline silicon layer is slow, thereby resulting in costing large expenses and at the same time, furthermore, there is a large amount of economic expenses caused by higher use loss ratio of silicon raw materials, that has to be a costly as a whole.

As another method of advantageously growing a polycrystalline silicon layer, a method of amorphous silicon being polycrystallized by making amorphous silicon contact with metallic catalyst and heating it has been proposed by R. C. Cammarata et al., J. Mater. Res., Vol. 5, No. 10 (1990) p. 2133–2138.

It is indicated, according to this method, that forming a film of polycrystalline silicon can be performed at low temperature and high rate. Especially crystallization at lower temperature can be achieved, for example, by introducing a trace quantity of Ni metal and heating it.

Then, according to this method, in the case where a thin film just like a TFT element in the order of 100 nm thickness is a subject, it is ascertained by L. K. Lam et al., Appl. Pys. Lett., Vol. 74, No. 13 (1999) pp. 1866–1868 that crystallization proceeds a few $\mu$m in the inplane direction, therefore, a crystal of high quality which is oriented quite well in the inplane direction can be obtained. Moreover, as a method of applying this orientation growth, a method in which amorphous silicon is crystallized by a metallic catalyst being selectively arranged nearby the position of a TFT element and by performing heating process to it and high performance is contemplated by forming an element with a grain of the crystal has been also proposed in Japanese Patent Application Laid-Open Publication No. 6-244104.

However, according to conventional methods shown here, since any one of them has a limitation involving with an area being crystallized, it is difficult to apply these methods to the production of a semiconductor device for a solar cell.

In a semiconductor device for use in a solar cell, although the thickness of a silicon film is required around 1 $\mu$m since a sufficient optical absorption is required within a film, when such a thick film is a subject, an area where crystallization can be performed by conventional methods is only in the order of 100 $\mu$m$^2$. Even if a metallic catalyst is formed on the entire surface of an amorphous silicon layer of an area suitable for a solar cell and heating process is performed to it, a silicon layer thus obtained represents only an arborescent growth which is branched and heterogeneous, it is impossible to obtain a good silicon layer which is crystallized in uniformity.

SUMMARY OF THE INVENTION

Accordingly, the first object of the present invention is to provide a crystalline silicon semiconductor device having a polycrystalline silicon layer which is oriented in a uniformed manner on the whole area suitable for a solar cell in a semiconductor device in which a polycrystalline silicon layer is grown by using a metallic catalyst, and a method for fabricating it.

Moreover, the second object of the present invention is to provide a crystalline silicon semiconductor device at an advantageous cost in which a polycrystalline silicon layer having a predetermined thickness can be efficiently formed on a cheap substrate and its method for fabrication.

In order to achieve the above-described first object, the present invention provides a crystalline silicon semiconductor device characterized in that it comprises a substrate and a polycrystalline silicon layer formed by amorphous silicon layer provided on the substrate and heat-treated in the presence of a metallic catalyst, the polycrystalline silicon layer is consisted of a polycrystalline silicon layer which is grown by heat-treating the amorphous silicon layer in the presence of the metallic catalyst dispersed in a dotted shape at lower portion or upper portion of the amorphous silicon layer.

Moreover, in order to achieve the above-described first object, in a method of a crystalline silicon semiconductor device forming a polycrystalline silicon layer of a predetermined thickness on a substrate, the present invention provides a method of a crystalline silicon semiconductor device characterized in that an amorphous silicon layer of a predetermined thickness is formed on a metallic catalyst dispersed in a dotted shape on the substrate and the amorphous silicon layer of the predetermined thickness is crystallized into a polycrystalline silicon layer by heat-treating the amorphous silicon layer of the predetermined thickness.

Furthermore, in order to achieve the above-described first object, in a method for fabrication of a crystalline silicon semiconductor forming a polycrystalline silicon layer of a predetermined thickness on a substrate, the present invention provides a method for fabrication of a crystalline silicon semiconductor device characterized in that a metallic catalyst is dispersed in a dotted shape on an amorphous silicon layer of the predetermined thickness formed on the substrate and the amorphous silicon layer of the predetermined thickness is crystallized into a polycrystalline silicon layer by heat-treating the amorphous silicon layer of the predetermined thickness.

The above-described amorphous silicon layer, in most cases, is consisted of an intrinsic (i type) silicon, and polycrystal layer which is grown by this is also consisted of a substantially intrinsic silicon. Moreover, on both surfaces of this polycrystalline silicon layer, amorphous silicon layers of n-type and p-type which are different electrically conductive types are commonly formed. It is desirable that a polycrystalline silicon layer is formed in a thickness of more than 0.6 μm in order to secure the optical absorption characteristic.

In the above-described method for fabrication, as means for dispersing a metallic catalyst in a dotted shape on a substrate, a method of providing a concave portion on the surface of the substrate and making the metallic catalyst positioned in this concave portion is easy to be performed. Concretely, a method in which salt solution of the metallic catalyst is applied and dried on the surface of the substrate providing a concave portion thereby leaving the metallic catalyst in a thick film state within the concave portion remained is secured one. As a concave portion, it is preferable that its cross section is V-shaped one. Moreover, a method in which a convex portion is formed on the surface of the substrate and a metallic catalyst covers on the convex portion is also preferable, in most cases, transparent electrodes are provided in concave and convex shapes on the substrate, these concave and convex portions are consisted of concaves and convexes of these transparent electrodes.

It is possible that another film is formed on the substrate covered by a film of a metallic catalyst and the metallic catalyst is exposed from a pinhole by forming a pinhole on this film thereby contemplating dispersion of dotted metallic catalyst instead of forming concave and convex portions on the substrate. In this case, as a shape of a pinhole, it is preferable to be a non-circular shape such as elliptic, square or rectangular shape, in the case where a pinhole is formed in such a non-circular shape, orientation of a polycrystalline silicon which is growing will be enhanced. Provided that formation of a pinhole of circular shape is not denied. A formation of a pinhole to other film on a metallic catalyst is easily performed by selecting condition of formation of film or laser beam machining and the like.

As other method for dispersing a metallic catalyst in a dotted shape, a method in which a thin film of a metallic catalyst formed on a substrate is heat-treated thereby aggregating the film of the metallic catalyst and dispersed places in dotted shape being formed by aggregated portion can be also contemplated.

A metallic catalyst dispersed in a dotted shape is not limited to be formed on the substrate. The metallic catalyst maybe dispersed at the upper portion of amorphous silicon layer formed on the substrate. As a method for dispersing the metallic catalyst in a dotted shape at the upper portion of amorphous silicon layer, the aggregation of the metallic catalyst film by means of the above-described heat-treatment is preferable.

In a method for fabrication of the present invention, it is preferable that a metallic catalyst to be dispersed in a dotted shape at the lower portion or upper portion of an amorphous silicon layer, in order to grow a polycrystalline silicon layer sufficient at the lower limit, in order to secure the effect of scattering of the metallic catalyst at the upper limit, is provided so that the metallic catalyst occupies 0.1–50% of an area of the lower or upper portion of the amorphous silicon layer. It should be noted that dotted shape indicating a state of formation of the metal may be dotted literally as they are or may also be scattered in a plane-like. Briefly, these are determined by the relationship with the amorphous silicon layer, and there is no limitation for its largeness.

It is preferable that heating-treatment for growing a polycrystalline silicon layer from an amorphous silicon layer is performed in the atmosphere of nitrogen, vacuum, hydrogen, Ar or halogen and the like. Moreover, although heat-treatment is commonly performed at a certain temperature, for example, it is possible to be performed in the form of heating at the predetermined heat treatment temperature after a level of hydrogen in a film is set less than 1% or preferably, less than 0.3% and the like by heating in the order of 400° C. in the atmosphere of hydrogen, in the case where the heating treatment is performed in a stepwise manner, the orientation of a polycrystalline silicon layer obtained can be made better.

As a component of a metallic catalyst, it is preferable to be selected from Ni, Fe, Co, Pt, Cu, Au or a chemical compound such as alloy including them and the like. As a component of a substrate, a transparent material such as glass, ceramic, sapphire, quartz or the like or a metal material such as SUS, Al, tungsten, metallic silicon or the like is used. It is possible that light scattering effect is given by forming fine concave and convex on the surface of a metal substrate such as SUS or the like thereby contemplating an increase of short circuit current.

In order to achieve the above-described second object, the present invention provides a crystalline silicon semiconductor device characterized in that it includes a polycrystalline silicon layer of one electrically conductive type having the predetermined orientation formed on a substrate, a substantially intrinsic polycrystalline silicon layer having the predetermined orientation formed on the basis of crystallization of a substantially intrinsic amorphous silicon layer formed on the polycrystalline silicon layer of one electrically conductive type by making the polycrystalline silicon layer of one electrically conductive type as the seed crystal layer.

Moreover, in order to achieve the above-described second object, the present invention provides a crystalline silicon semiconductor device characterized in that it includes a polycrystalline silicon layer of one electrically conductive having the predetermined orientation formed on a substrate, a substantially intrinsic polycrystalline silicon layer having the predetermined orientation formed on the basis of the crystallization of a substantially intrinsic amorphous silicon layer formed on the polycrystalline silicon layer of one electrically conductive type by making the polycrystalline silicon layer of one electrically conductive type as a seed crystal layer and non single crystalline silicon layer of other one electrically conductive type formed on a polycrystalline silicon layer formed on the basis of the crystallization.

In addition, in order to achieve the above-described second object, in a method for fabricating a crystalline silicon semiconductor device forming a polycrystalline silicon layer of the predetermined thickness on a substrate, the present invention provides a method for fabricating a crystalline silicon semiconductor device characterized in that a polycrystalline silicon layer oriented on any one of a face (111), a face (110) and a face (100), a metallic catalyst layer and an amorphous silicon layer of the predetermined thickness are formed on the substrate, the amorphous silicon layer of the predetermined thickness is crystallized into a polycrystalline silicon layer having an orientation by performing heat-treatment to the amorphous silicon layer of the predetermined thickness.

As describe above, since the present invention crystallizes an amorphous silicon into a polycrystalline silicon by a metallic catalyst and heat-treatment, the present invention will have a lower cost characteristic not found in conventional methods. Specifically, an amorphous silicon can be grown in a high rate without consideration of the nature of a film, therefore, if an amorphous silicon is deposited and crystallized, a polycrystalline silicon layer of the predetermined thickness can be formed at much more rapid rate than conventional ones.

Even if the time for forming a polycrystalline silicon layer oriented in any one of the orientations (hereinafter, refer to as simply "oriented") and a metallic catalyst layer and the time for heat treatment are considered, it becomes a much shorter work time than that of conventional methods, therefore cost reduction can be contemplated. Moreover, since the work time is shorter, it also results in advantageously reducing loss of raw materials.

As a position of formation of a metallic catalyst layer promoting the crystallization of an amorphous silicon, it is preferable to suppose any position of inside of a polycrystalline silicon layer oriented, between a polycrystalline silicon layer oriented and an amorphous silicon layer, or on the back face of a polycrystalline silicon layer oriented contacting with an amorphous silicon layer. As a component of a metallic catalyst layer, it is preferable to select from Ni, Fe, co, Pt, Cu or Au in the viewpoint of making the crystallization of an amorphous silicon layer efficient.

As for the position relationship between a polycrystalline silicon layer oriented and an amorphous silicon layer, it will be good whether the former is positioned on the side of substrate with respect to the latter, or the former is positioned on the side of surface with respect to the latter, in either case of them, an amorphous silicon can be polycrystallized under the good orientation. Upon the upper surface and the lower surface of an amorphous silicon layer, polycrystalline silicon layers are formed, and it is practical that one of them is made p-type and the other is made n-type. Moreover, in this case, it is possible to constitute a silicon layer not on the side of a polycrystalline silicon layer oriented with a microcrystal or an amorphous silicon thin film.

As a method for forming a metallic catalyst layer within a polycrystalline silicon layer oriented, ion implantation method or plasma doping method is suitable. Moreover, it is possible to take the form in which a metallic catalyst layer is formed within a polycrystalline silicon layer through the mediation of a thin film of the metallic catalyst between a plurality of polycrystalline silicon layers. As a means for forming a metallic catalyst layer on the surface of a polycrystalline silicon layer oriented, vapor deposition method, spin coating method of metal salt solution or the like is suitable.

A metallic catalyst moves in an amorphous silicon layer during heat treatment in a direction of thickness from one side to the other side and acts to polycrystallize an amorphous silicon during this movement. Therefore, it will be enough that its amount is a trace amount, as a thickness of a thin film formed, it is common to be formed into a thickness in the order of a few angstroms.

An amorphous silicon layer is formed by vapor deposition method, p-CVD method, CVC method, sputtering method or the like. Its thickness is decided by a thickness necessary for optical absorption as a semiconductor device, in most cases, the range of 500 nm–10 $\mu$m is set, however, there is also a case of a thickness of the order of 50 $\mu$m.

As a temperature of heat treatment, it is preferable to be in a range of 450–700° C., more preferably, 500–600° C. Moreover, heat treatment may be performed in one step, or heat treatment may be performed, for example, in following two steps: a step of reducing the amount of hydrogen in a layer to less than 1%, preferably 0.3% by preheating to around 400° C. in the atmosphere of hydrogen and a step of heating to the above-described temperature. As an atmosphere of heat treatment, hydrogen, nitrogen, Ar, halide or vacuum is preferable.

As a component of a substrate, there are various components depending on an incident direction of light to a semiconductor device. In the case where an incident light from the side of substrate is utilized, a transparent glass, a transparent ceramic, a quartz, sapphire or the like is used, and in the case where an incident light from the opposite side, SUS, Al, tungsten or a metal plate such as a metallic silicon or the like is used, It is possible that concave and convex are formed on the surface of a metal substrate and thereby increasing a short circuit current by scattering an incident light on the surface of substrate.

BRIEF DESCRIPTION OF THE DRAWINGS

The invention will be explained in more detail in conjunction with the appended drawings, wherein:

FIGS. 1A through 1G are illustrations showing a crystalline silicon semiconductor device and its method for fabrication of the first embodiment of the present invention, in which

FIGS. 4A and 4B are illustrations showing a crystalline silicon semiconductor device and its method for fabrication of the fourth embodiment of the present invention.

FIGS. 5A and 5B are illustrations showing a crystalline silicon semiconductor device and its method for fabrication of the fifth embodiment of the present invention, FIGS. 6A and 6B are illustrations showing a crystalline silicon semiconductor device and its method for fabrication of the sixth embodiment of the present invention.

DESCRIPTION OF THE PREFERRED EMBODIMENTS

FIGS. 1A through 1G show a crystalline silicon semiconductor device and its method for fabrication of the first embodiment of the present invention, and an example for a semiconductor device in which light is incident from the side of substrate. First, in FIG. 1A, a substrate 1 of a transparent glass is prepared, on which a transparent electrode 2 is formed in concave and convex shapes, constituted of crystallized $SnO_2$ of 1 µm in thickness. Size of the concave and convex is on order of 1 µm.

Figure 1A:
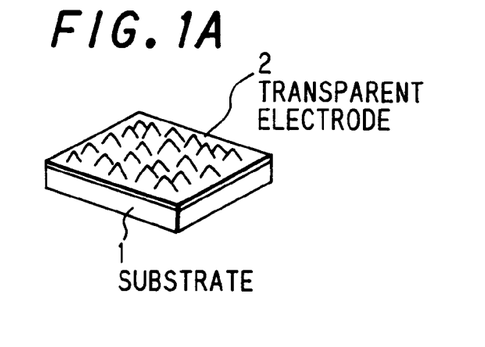
FIGS. 1A to 1F are drawings showing a procedure of its fabrication and FIG. 1G is an illustration showing a growing mechanism of a polycrystalline silicon layer.
Figure 1B:
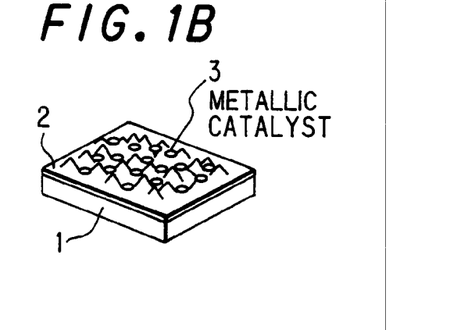

Next, after acetate solution of Ni is applied to this transparent electrode 2, it is dried. FIG. 1B shows the results, on the surface of the transparent electrode 2, a metallic catalyst 3 is dispersed in a dotted shape in the concave portion of the concave and convex portions.

In addition to the metallic catalyst 3 being dispersed in a dotted shape as described above, the reference numeral shown in FIG. 1C denotes an amorphous silicon layer which is grown to 2 µm in thickness based on plasma CVD method.

Figure 1C:
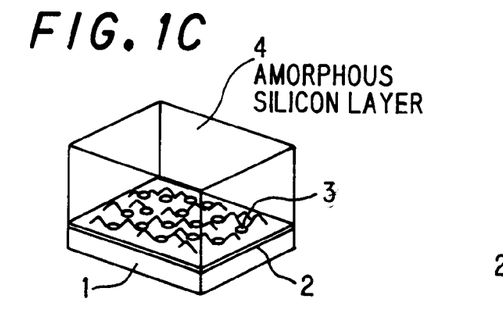

As for this silicon layer 4, a portion of 50 nm in thickness of the side of the substrate 1 is constituted of a mixed gas of $H_2$, $SiH_4$ and $B_2H_6$ so as to be p-type, its upper portion of 1.9 µm in thickness is constituted of a mixed gas of $H_2$ and $SiH_4$ so as to be i-type, and further, the top layer portion of 50 nm in thickness is constituted of a mixed gas of $H_2$, $SiH_4$ and $PH_3$ so as to be n-type. Any one of these respective layers is grown under the conditions of pressure 0.3 tore, temperature of the substrate 200° C. and RF frequency 80 MHz.

Figure 1D:
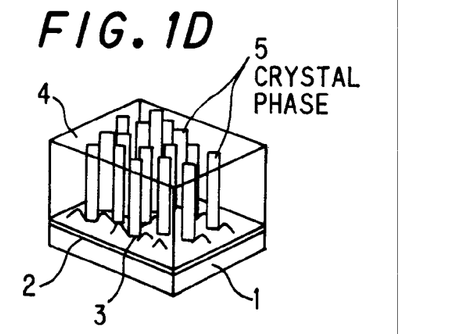

FIG. 1D shows a stage on the way during the time of laminated body as constituted above being heat-treated. The heat treatment is performed at 550° C. for 10 minutes in the atmosphere of nitrogen, thereby generating an diffusion of Ni from the metallic catalyst 3 dispersed in a dotted shape to the direction of thickness and resulting in a crystal phase 5 being grown from a portion of the metallic catalyst 3. Ni diffused in an amorphous silicon layer 4 is segregated to the top of the surface of a layer 4.

Figure 1E:
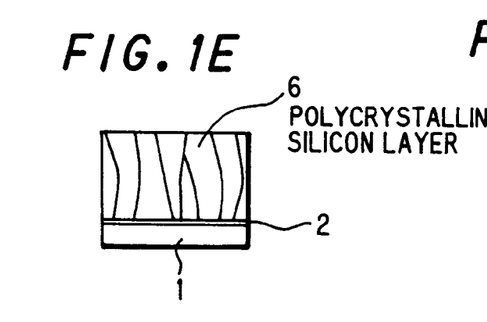

As further continuing heat treatment, the crystal phase 5 continues to grow and integrates each other, thereby forming a polycrystalline silicon layer 6 as shown in FIG. 1E. When this polycrystalline silicon layer 6 is made be a subject and its crystallization is analyzed, and then, it was recognized that as a whole the crystallization is oriented in a uniformed manner on the face (111).

Figure 1F:
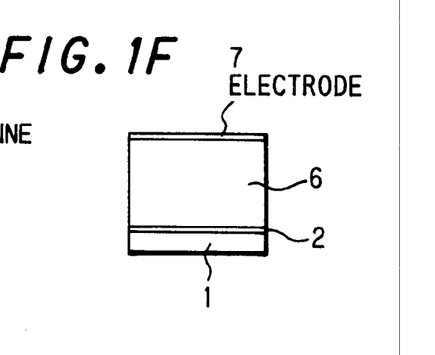

FIG. 1F shows a semiconductor device as a solar cell constituted of an electrode 7 of A1 of 1 µm in thickness deposited on the surface of the polycrystalline silicon layer 6. When a plurality of semiconductor devices are connected on the basis of well known method connecting the electrode 2 and the electrode 7 of this semiconductor device in series, also in connection in the latter part, a characteristic that each voltage held by each semiconductor is integrated can be obtained and it was recognized that it has excellent nature as a solar cell.

Figure 1G:
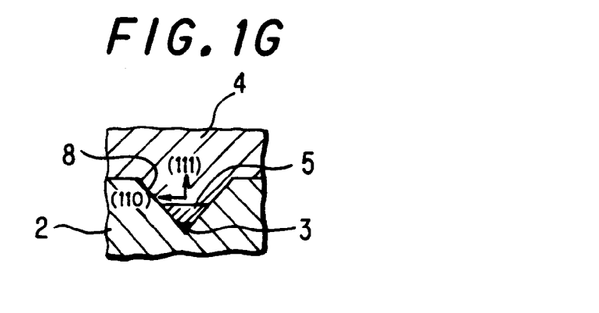

FIG. 1G shows a mechanism of growth of the polycrystalline silicon layer 6, in this FIG. 1G, the reference numeral 8 denotes one of concave portions that the transparent electrode 2 has, and its cross section is formed in a V shape. In the bottom portion of a concave 8, the metallic catalyst 3 is positioned, and further upper portion of it is covered by the amorphous silicon layer 4. In such a state, when the amorphous silicon layer 4 is heat-treated, diffusion of Ni is generated by the metallic catalyst 3 into internal of the amorphous silicon layer 4 and the crystal phase 5 grows. The crystal phase 5 grows so that it has crystal constitution in which the face (111) is oriented in a direction of thickness of the silicon layer 4, and further, it connects with the crystal phase 5 grown from other concave 8 and integrates with each other, thereby resulting in the polycrystalline silicon layer 6 as shown in FIG. 1E and FIG. 1F.

Although the polycrystalline silicon layer 6 grown as described above is recognized that it contains hydrogen of 0.1–5%, its orientation has indicated particularly good results in the range between 0.1–2% in hydrogen concentration. Moreover, Ni, at first, positioned at the lower portion of the amorphous silicon layer 4 extinguished by moving to the upper face of the polycrystalline silicon layer 6, and the high quality polycrystalline silicon layer 6 of i-type was realized. The concentration of Ni remained in the polycrystalline silicon layer 6 is in the order of $2\times10^{17}/cm^3$ at most, and Ni of this degree does not have bad influence on the characteristic as a solar cell.

It should be noted that in the first embodiment, when a heat treatment method having a form of two steps in which a heat treatment of the amorphous silicon layer 4 was once performed in the hydrogen atmosphere at 400° C. and then a heat treatment was performed at 550° C. was tried, the polycrystalline silicon layer having a good orientation could be obtained.

In the case of the first embodiment, n-type layer formed its lower position during formation of the amorphous silicon layer 4 is consisted of amorphous materials, however it will be good whether it is consisted of a microcrystal of the order of 0.05 µm in particle diameter or it is consisted of a polycrystal of the order of 0.1 µm in particle diameter. Moreover, as its most suitable thickness, it is preferable to set in the range between 10 and 100 nm, particularly, between 30–60 nm. As the electrode 7, Ag, Mo and the like are preferable other than Al.

FIGS. 2A through 2G show a crystalline silicon semiconductor device an its method for fabrication of the second embodiment of the present invention, and an example for a semiconductor device in which light is incident from the opposite side of substrate.

Figure 2A:
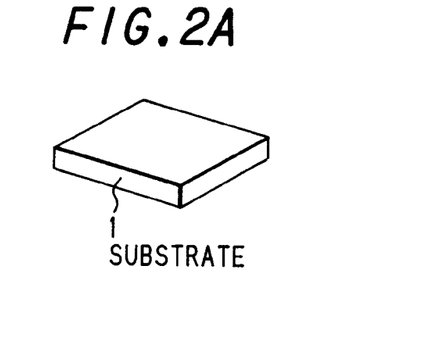
FIGS. 2A through 2G are drawings showing a procedure of fabrication of a crystalline silicon semiconductor device of the second embodiment of the present invention.
Figure 2B:
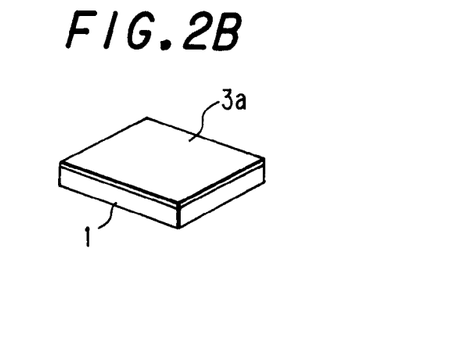

In FIG. 2A, first, the substrate 1 of SUS is prepared, on which Ni layer 3a is formed as shown in FIG. 2B. Ni layer 3a is formed into a thickness of 10 nm by sputtering and subsequently on which a thin film 9 of $SiO_2$ is formed as shown in FIG. 2C.

In the thin film 9 of $SiO_2$, which is selected because of its smaller reactivity with an amorphous silicon layer, a pinhole 10 is formed depending on its forming film condition as shown in the figure, as a result of this, Ni layer 3a is exposed from the pinhole 10, thereby forming the metallic catalyst 3 dispersed in a dotted shape.

Figures 2C, 2D:
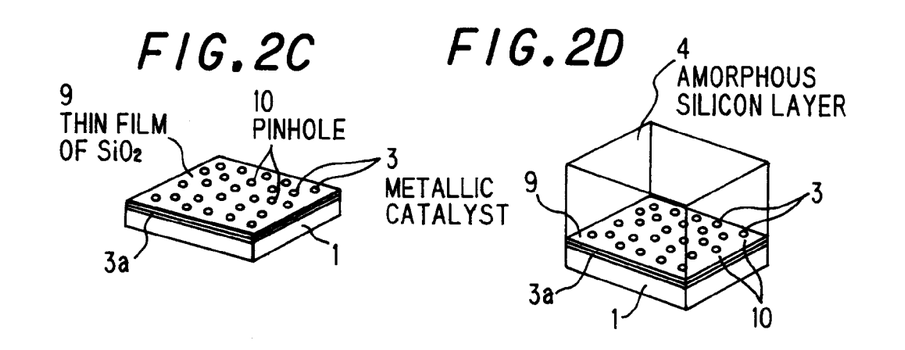

FIG. 2D shows a state in which the amorphous silicon layer 4 is formed on the substrate 1 by plasma CVD method. As for this amorphous silicon 4 formed in a thickness of 3 µm, its lowest portion of 50 nm portion is constituted of a mixed gas of $H_2$, $SiH_4$ and $PH_3$ so as to be n-type, its upper portion of 2.9 µm in thickness is constituted of $H_2$, $SiH_4$ and a trace amount of $PH_3$ so as to be n-type, further, the top layer of 50 nm portion in thickness is constituted of $H_2$, $SiH_4$ and $B_2H_6$ so as to be p-type, and anyone of these respective layers is grown under the conditions of pressure 0.3 torr, substrate temperature 200° C. and RF frequency 60 MHz.

Figure 2E:
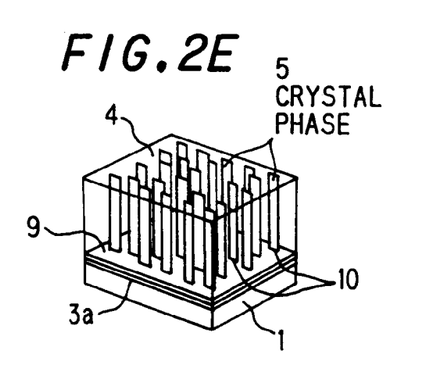
Figure 2F:
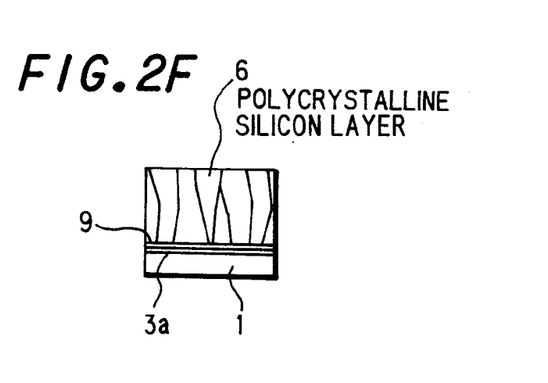

FIG. 2E shows the heat-treated results of the amorphous silicon 4. The heat treatment is performed in the atmosphere of nitrogen at 500° C. for 60 minutes, thereby generating diffusion of Ni in the direction of thickness of the amorphous silicon layer 4 from the metallic catalyst 3 exposed in a dotted shape through the pinhole 10, and therewith the crystal phase 5 is grown from an portion of the pinhole 10. The crystal phase 5 is further grown by continuing the heat treatment and finally they integrates with each other as shown in FIG. 2F to be a predetermined polycrystalline silicon layer 6. It should be noted that an amount of adverse of diffused Ni does not remain in the layer 6 as similar to the case of FIG. 1.

Figure 2G:
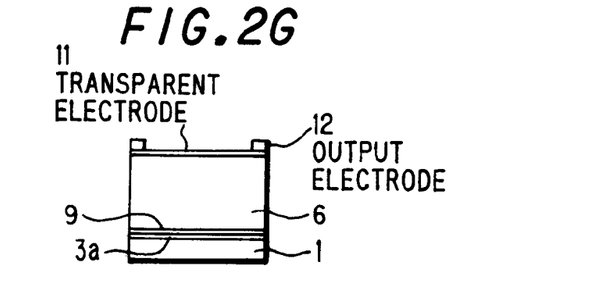

As crystallization of the polycrystalline silicon layer 6 obtained from the steps described above is examined, it has been recognized that it is oriented on a face (110) in a uniformed manner as a whole. Sequentially, as shown in FIG. 2G, a predetermined semiconductor device is constituted of the transparent electrode 11 being formed to a thickness of 70 nm with ITO (indium tin oxide) on the upper surface of the polycrystalline silicon layer 6, and furthermore, an output electrode 12 of Ag being formed at a peripheral edge of the electrode 11. When performance of a solar cell of this semiconductor device is tested, a photoelectric characteristic, which is an identical level with that of the semiconductor device shown in FIG. 1, is shown.

It should be noted that in this second embodiment of the present invention, although the thin film 9 is consisted of $SiO_2$, using SiN is possible. If the formation of SiN film made by plasma CVD method and heat treatment are combined, a good pinhole is capable of being formed by hydrogen desorption due to the heat treatment. Moreover, it is possible that the thin film 9 is constituted of a conductive film just like an Ag/ZnO lamination film other than an insulating film, and in this case, this film can be utilized as an electrode of a solar cell.

Figure 3A:
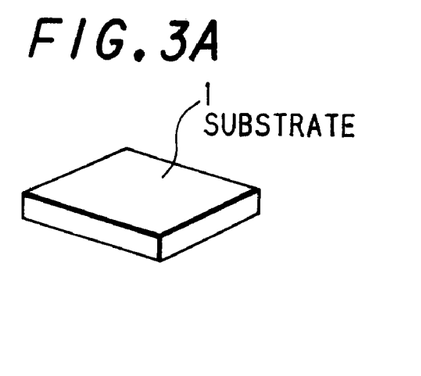
FIGS. 3A through 3F are drawings showing a procedure of fabrication of a crystalline silicon semiconductor device of the third embodiment of the present invention.
Figure 3B:
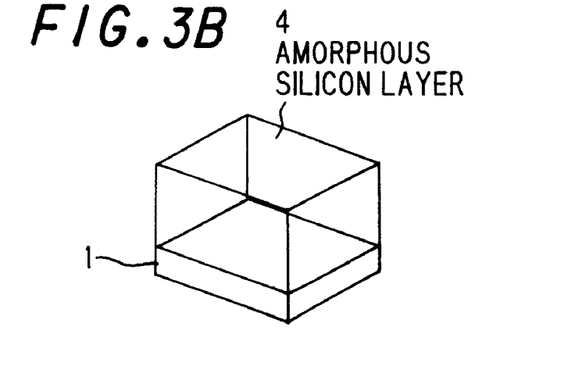

FIGS. 3A through 3F show a crystalline silicon semiconductor device and its method for fabrication of the third embodiment of the present invention and a semiconductor device in which a light is incident from the opposite side of the substrate. In FIG. 3A, the SUS substrate 1 is prepared, and on which the amorphous silicon layer 4 is formed as shown in FIG. 3B. The amorphous silicon layer 4 was formed on the n-type polycrystalline silicon layer provided on the surface of the substrate 1 described below.

First, a mixed gas of $H_2$, $SiH_4$ and $PH_3$ was introduced on the substrate 1, after a n-type randomly oriented polycrystalline silicon layer (not shown) was deposited by plasma CVD method under the conditions of pressure 0.3 torr, substrate temperature 200° C. and 13.56 MHz into a thickness of 20 nm, on which an i-type amorphous silicon layer 4 of 1.4 μm in thickness was formed at the rate of 15 nm/sec on the basis of electron beam deposition method.

It was recognized that hydrogen concentration within the layer 4 was 0.1% at this moment. Moreover, of the amorphous silicon layer 4 which was formed, in a portion of the top layer of 50 nm in thickness, a p-type layer was formed with a mixed gas of $H_2$, $Si_2H_6$ and $B_2H_6$. The formation of this p-type layer was performed under the conditions of pressure 0.3 torr, substrate temperature 200° C. and 45 MHz.

Figure 3C:
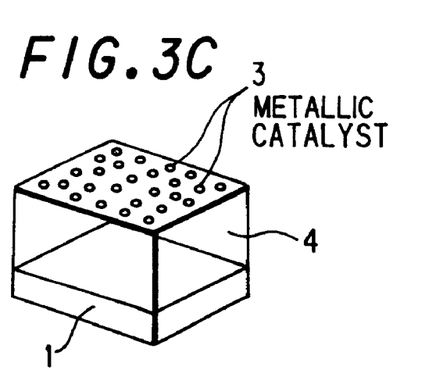

The reference numeral 3 shown in FIG. 3C denotes a metallic catalyst provided and dispersed in a dotted shape on the upper surface of the amorphous silicon layer 4. This metallic catalyst 3 is made through the step that Ni film of 3 Å in thickness is first formed on the upper face of the amorphous silicon layer 4 by electron beam deposition method, subsequently the film is annealed by heat treatment at 400° C. for 20 minutes and aggregated into a dotted shape.

Figure 3D:
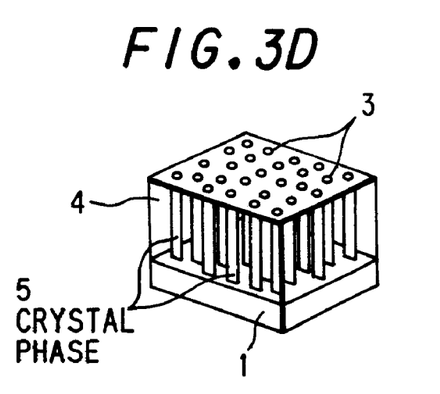

FIG. 3D shows the results that the above-described lamination body is performed by heat treatment, specifically, Ni is dispersed within the amorphous silicon layer 4 from the metallic catalyst 3 which is located on the upper face in a dotted shape, and therewith resulting in the crystal phase 5 growing from the metallic catalyst 3. The heat treatment was performed by repeating rapid thermal annealing at 600° C. for 2 minutes three times.

Figure 3E:
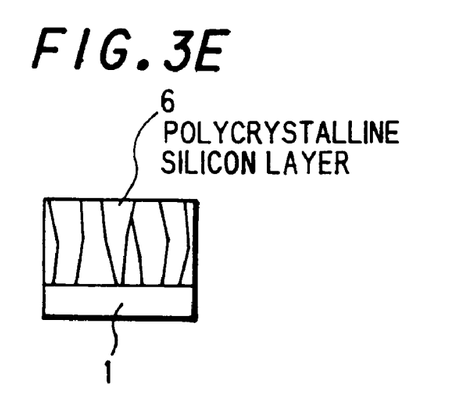

The crystal phase 5 is not only grown from each of the metallic catalyst 3 located in a dotted shape with a good orientation, but also integrated between themselves, as a results, as shown in FIG. 3E, the polycrystalline silicon layer 6 was formed with entirely uniform orientation. Most of the diffused Ni are to be incorporated into the n-type polycrystal layer on the substrate 1, and an amount of adverse does not remain in the i-type polycrystalline silicon layer 6.

Figure 3F:
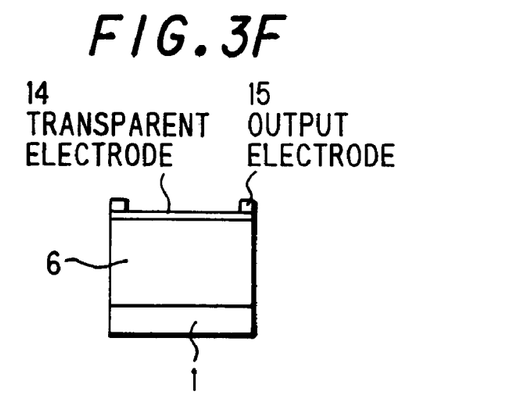

The reference numeral 14 shown in FIG. 3F denotes a transparent electrode made of ITO formed on the upper surface of the polycrystal layer 6, and the reference numeral 15 denotes an output electrode made of a composite film (thickness: 20 nm/1 μm) of Ti/Al formed at an edge of the electrode 14. As a result that performance of this semiconductor device as a solar cell is tested, a photoelectric characteristic which was identical with that of the semiconductor device shown in FIG. 1 was obtained.

In this third embodiment of the present invention, although an i-type amorphous silicon layer was formed on the basis of electron beam deposition method, unless it is a method of introducing impurity, the formation is possible by other methods such as plasma CVD method, CVD method and the like. Moreover, although a p-type layer is formed on an i-type amorphous silicon layer, and they are heat-treated in a lump, a p-type layer (or n-type layer) may be formed after i-type amorphous silicon layer is heat-treated. Furthermore, a n-type polycrystal layer is formed beneath the amorphous silicon layer in the present embodiment of the present invention, however, this layer is not altered by the heat treatment for the amorphous silicon layer, therefore, according to this, for example, an embodiment that a metallic catalyst and an amorphous silicon layer are formed on a p-type or a n-type polycrystal layer thereby being heat-treated is possible.

According to a crystalline silicon semiconductor device and its method for fabrication of the first embodiment through the third embodiment of the present invention, since the polycrystalline silicon layer 6 is grown by dispersing the metallic catalyst 3 in dotted shape to the lower portion or the upper portion of the amorphous silicon layer 4 formed on the substrate 1 and heat treating them, the grown polycrystalline silicon layer 6 has an orientation in a uniformed manner all over, therefore, an excellent crystalline silicon semiconductor device having a high photoelectric performance can be provided.

Moreover, TFT element of amorphous or polycrystal material can be formed on the same substrate since they have common processes. The formation of a pn diode is also possible, therefore, it has an advantage capable of easily producing a composite element having a solar cell and a circuit element on the same substrate. Moreover, as a usage of it, for example, a power source of domestic power supply system or a power source for portable devices such as an electronic calculator and a watch can be contemplated.

Figure 4A:
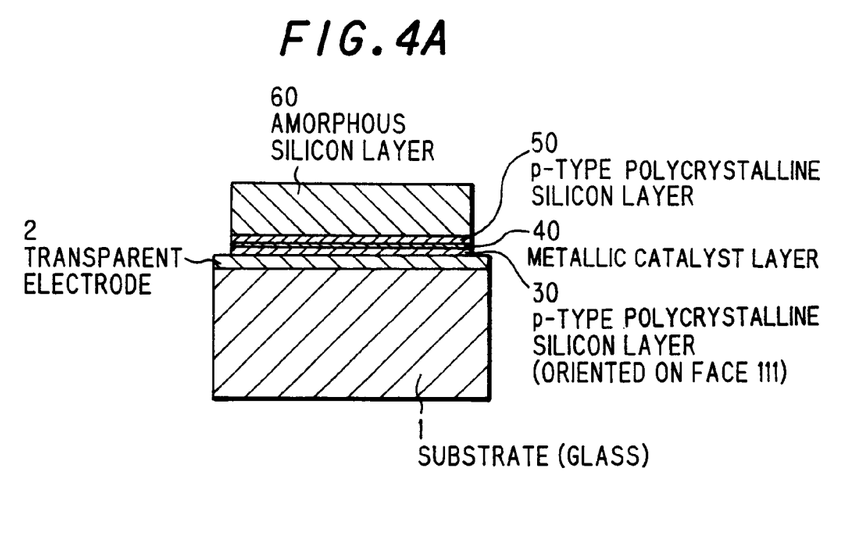
FIG. 4A is a drawing showing a structure of a semiconductor device before heat treatment and FIG. 4B is a drawing showing a completed structure as a semiconductor device.
Figure 4B:
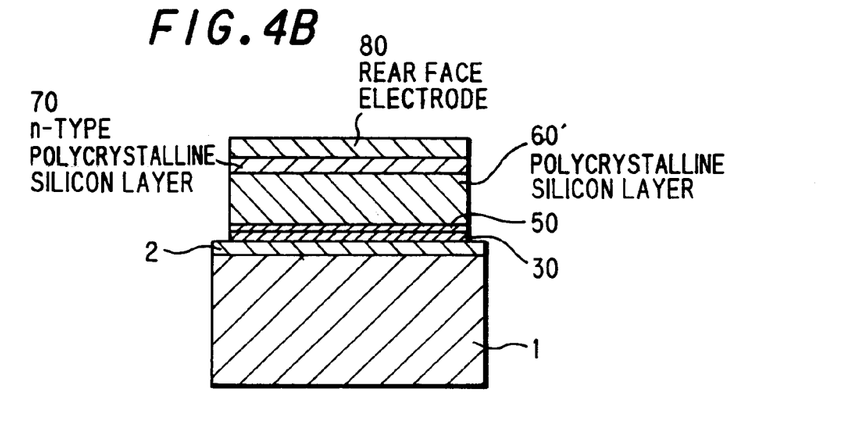

FIGS. 4A and 4B show a crystalline silicon semiconductor device and its method for fabrication of the fourth embodiment of the present invention, and its subject is a semiconductor device in which a light is incident from the side of the substrate. First, the substrate 1 of a transparent glass is prepared as shown in FIG. 4A, after forming the transparent electrode 2 of $SnO_2$ of 800 nm in thickness having convex and concave on it, a mixed gas of $H_2$, $SiH_4$ and $B_2H_6$ is introduced on the surface of the transparent electrode 2, a p-type polycrystalline silicon layer 30 of 20 nm in thickness is formed by p-CVD method under the conditions of pressure 0.5 torr, substrate temperature 400° C. and RF frequency 50 MHz.

It was recognized that this polycrystalline silicon layer 30 is, for the most part, oriented on the face (111) in the direction of thickness. 0.1–5% of hydrogen is contained depending on the conditions, however, the orientation was especially good when 0.1–0.2% of hydrogen was contained.

Next, the metallic catalyst layer 40 of 1 nm in thickness was formed by deposition of Ni, and further on which a p-type polycrystalline silicon layer 50 of 20 nm in thickness was formed under the same conditions with those of the polycrystalline silicon layer 30. In this case, the polycrystalline silicon layers 30 and 50 should be made thinner as possible because of a light incident from the side of the substrate 1, and it is preferable that the total of its thickness is set in the order of 8–100 nm in total.

The reference numeral 60 denotes an amorphous silicon layer of an i-type (intrinsic) formed on the polycrystalline silicon layer 50. It is formed by introducing a mixed gas of $H_2$ and $SiH_4$ on the surface of the polycrystalline silicon layer 50 and formed by p-CVD method under the conditions of pressure 0.5 torr, substrate temperature 420° C. and frequency 60 MHz and it has a thickness of 2 μm. The hydrogen concentration that this amorphous silicon layer 60 contains is, at most cases, 0.5–8%.

Next, the above-described lamination object was put into the nitrogen atmosphere, heated at 550° C. and diffusion of Ni was performed. Ni element constituting the metallic catalyst 40 is diffused within the amorphous silicon layer 60 through the polycrystalline silicon layer 50 by this heat treatment, and as a result, the amorphous silicon layer 60 is transformed to a polycrystalline silicon layer of good quality oriented in the direction of thickness of film.

The reference numeral 60' in FIG. 4B shows a polycrystalline silicon layer crystallized by heat treatment, It was recognized that this polycrystalline silicon layer 60' has a good crystal structure and it was recognized that the hydrogen concentration of its internal portion was reduced to 0.1–2%. It was recognized that the metallic catalyst 40 is vanished since it moves to the surface of the polycrystalline silicon layer 60', and it was further recognized that Ni element within the polycrystalline silicon layer 60' remained only in the order of a trace amount.

Suppose that the crystallization of the polycrystalline silicon layer 60' is not good, in that case, Ni atoms are remained at the crystal defect position within the layer, even in that case, the maximum concentration is only in the order of $2 \times 10^{17}/cm^{-3}$, therefore, Ni in such a concentration does not have an adverse influence on the characteristic of a solar cell. If it has a good crystal structure, there is no problem.

Next, a mixed gas of $H_2$, $SiH_4$ and $PH_3$ is introduced on the surface of the polycrystalline silicon layer 60', after a n-type polycrystalline silicon layer 70 is formed under the conditions of pressure 0.3 torr, substrate temperature 200° C. and frequency 13.56 MHz by p-CVD method, a rear face electrode 80 of Al of 1 μm in thickness was formed by ecaporation method, thereby resulting in a predetermined crystalline silicon semiconductor device. When a plurality of semiconductor devices are connected on the basis of a method for connecting between the transparent electrode 2 and the rear face electrode 80 of the semiconductor device in series obtained by the described method, the characteristic totaling respective voltages that respective semiconductor device have was obtained even in the connection of the latter part.

It should be noted that, in this fourth embodiment of the present invention, although the formation position of the metallic catalyst layer 40 is made between the polycrystalline silicon layers 30 and 50 which have the same thickness, it will be good whether the thickness of the polycrystalline silicon layers 30 and 50 is made different, or it formation position is made beneath the polycrystalline silicon layer 30 or above the polycrystalline silicon layer 50. The closer to the amorphous silicon layer 60 it is formed, the faster the polycrystalline silicon layer 60' is generated.

Moreover, in this fourth embodiment of the present invention, the layer 70 is constituted of the polycrystalline silicon, however, it may be constituted of an amorphous silicon. The optimized thickness of film of this layer 70 is, depending on crystallization, 10–100 nm, more preferably, 30–60 nm. As a material of the rear electrode 80, Ag, Mo or the like other than Al is preferably suitable.

Figure 5A:
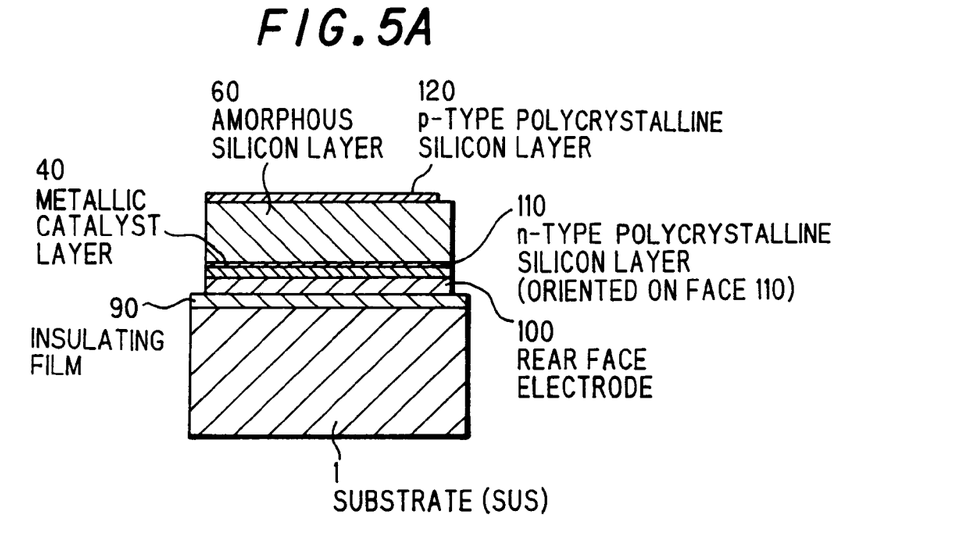
FIG. 5A is a drawing showing a structure of a semiconductor device before heat treatment and FIG. 5B is a drawing showing a complete structure as a semiconductor device.
Figure 5B:
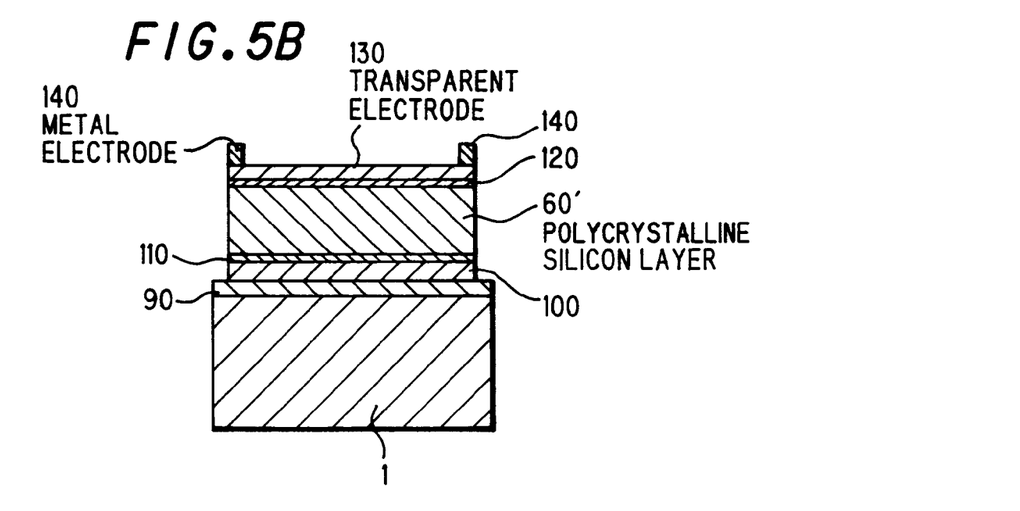

FIGS. 5A and 5B show a crystalline silicon semiconductor device and its method for fabrication of the fifth embodiment of the present invention, and relates to a semiconductor device constituted in such a manner that a light is incident from the opposite side of the substrate.

In FIG. 5A, first, the flexible SUS substrate 1 was prepared, after $SiO_2$ film of 200 nm in thickness was formed on the SUS substrate 1 as an insulating film 90, the rear face electrode 100 of SUS of 500 nm in thickness was formed on the insulating film 90.

Next, a mixed gas of $H_2$, $SiH_4$ and $PH_3$ was introduced on the surface of this rear face electrode 100, a n-type crystalline silicon layer 110 of 50 nm in thickness was formed under the conditions of pressure 0.3 torr, substrate temperature 200° C. and frequency 80 MHz by p-CVD method. When this silicon layer 110 was examined, it was recognized that a polycrystal structure is oriented on the face (110) in the direction of thickness.

Subsequently, after the metallic catalyst 40 was formed by spin coating Ni salt solution on the polycrystalline silicon layer 110 oriented and drying it, the i-type amorphous silicon layer 60 of 5 μm in thickness was formed by sputtering from silicon targeting material. This layer 60 was formed at the rate of 10 nm/sec. Moreover, when its hydrogen concentration was measured, the results of less than 0.1% was obtained.

Next, a mixed gas of $H_2$, $SiH_4$ and $B_2H_6$ was introduced on the surface of the amorphous silicon layer 60, after a p-type polycrystalline silicon layer 120 was formed under the conditions of pressure 0.5 torr, substrate temperature 400° C. and frequency 50 MHz by p-CVD method, this was put into the atmosphere of $H_2$ of 1 torr and heat treated at 550° C. for 30 minutes thereby resulting in crystallizing the amorphous silicon layer 60.

The reference numeral 60' shown in FIG. 5B denotes a polycrystalline silicon layer crystallized from the amorphous silicon layer 60 by the above-described method, Ni constituting the metallic catalyst 40 was incorporated into the polycrystalline silicon layer 120 passing through the polycrystalline silicon layer 60', and as a result, the metallic catalyst 40 was vanished.

Moreover, it was recognized that Ni hardly remained within the polycrystalline silicon layer 60', and further, within the amorphous silicon layer 60, hydrogen hardly remained except nearby interface of boundary with the polycrystalline silicon layers 110 and 120, therefore, the crystallization of the amorphous silicon layer 60 was efficiently proceeded. Moreover, crystal structure of the layer 60' of good quality was observed.

Next, ITO film of 70 nm in thickness was formed on this polycrystalline silicon layer 60' as a transparent electrode 130, further on which the metal electrode 140 of Al of 1 μm in thickness was locally provided, thereby constituting a predetermined crystalline silicon type semiconductor device.

It was recognized that it has an electric characteristic similar to that shown in FIG. 4, and further it was recognized that natural texture was formed on its surface as an advantage made by the face (110) orientation, which is different from the case of the face (111) orientation.

Figure 6A:
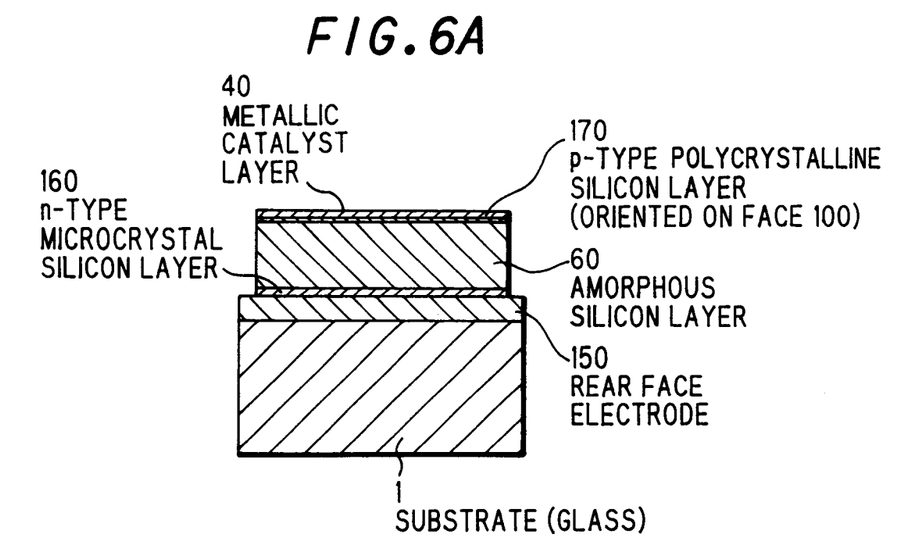
FIG. 6A is a drawing showing a structure of a semiconductor device before heat treatment and FIG. 6B is a drawing showing a completed structure as a semiconductor device.
Figure 6B:
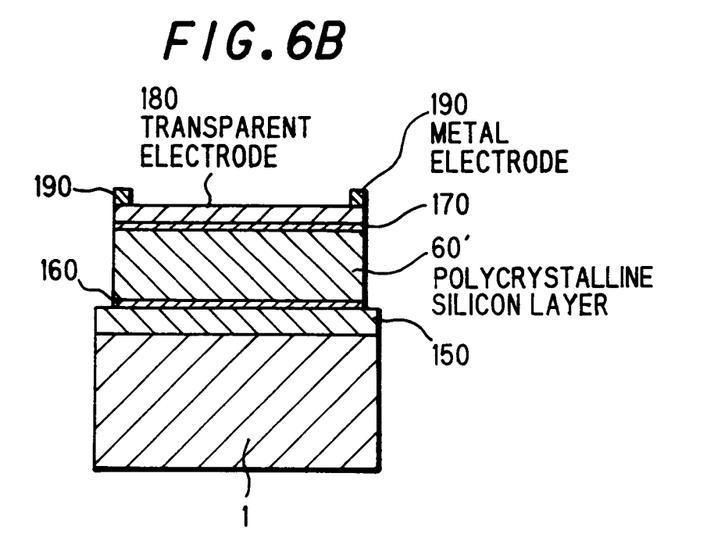

FIGS. 6A and 6B show a crystalline silicon semiconductor device and its method for fabrication of the sixth embodiment of the present invention, and is an example in which the polycrystalline silicon layer oriented on the face (100) and on the surface side of the amorphous silicon layer is arranged. In the same with the case shown in FIG. 5, alight is injected from the opposite side of the substrate. In FIG. 6A, the reference numeral 1 denotes a substrate of glass, first, on the surface of the substrate 1, a composite film of Ti/Ag/Ti of 50 nm/1 μm/50 nm in each thickness was formed as a rear face electrode 150.

Next, $H_2$, $SiH_4$ and $PH_3$ were introduced on the surface of this rear face electrode 150, a n-type microcrystal silicon layer 160 of 50 nm in thickness was formed under the conditions of pressure 0.3 torr, substrate temperature 200° C. and frequency 13.56 MHz by p-CVD method. When this silicon layer 160 was observed, a completely random-orientated microcrystal structure is obtained.

Subsequently, an i-type amorphous silicon layer 60 of 3 μm in thickness was formed on the microcrystal silicon layer 160 at the rate of 15 nm/sec. The result of an amount of hydrogen occupying in this layer 60 was measured and it was less than 0.1%. Subsequently, the metallic catalyst layer 40 of Ni of 3 Å in thickness was formed by electron beam deposition method, further, on which a mixed gas of $H_2$, $Si_2H_6$ and $B_2H_6$ was introduced, and a p-type polycrystalline silicon layer 170 of 15 nm in thickness was formed under the conditions of pressure 0.5 torr, substrate temperature 200° C. and frequency 50 MHz by p-CVD method.

It was recognized that this polycrystalline silicon layer 170 is oriented on the face (100) in the direction of thickness at least nearby the surface. Next, this was put into the atmosphere of $H_2$ of 1 torr, rapid thermal annealing was performed three times under the conditions of 600° C.×2 minutes/times thereby crystallizing the amorphous silicon layer 60. Ni element constituting the metallic catalyst layer 40 passed through the amorphous silicon layer 60, in this process, after the amorphous silicon layer 60 was polycrystallized, most of these were incorporated into the microcrystal silicon layer 160.

FIG. 6B shows a completed structure as a crystalline silicon semiconductor device. A ITO film of 70 nm in thickness was formed as a transparent electrode 180, further on which a metal electrode 190 of Ti/Al of 20 nm/1 μm in each thickness was locally formed and thereby resulting in a predetermined crystalline silicon type semiconductor device. The polycrystalline silicon layer 60' oriented on the face (100) had very low defect density in the layer, therefore a crystalline silicon semiconductor device obtained in this embodiment indicated a high mobility.

It should be noted that a crystalline silicon semiconductor device according to the present invention will be utilized for, for example, a power source of domestic power supply or a power source of portable devices such as an electronic calculator, a watch and the like as a solar cell.

As described above, according to a crystalline silicon semiconductor device and its method for fabrication of the fourth embodiment through the sixth embodiment of the present invention, since the polycrystalline silicon layers 30, 50, 110, 170 having a predetermined orientation, the metallic catalyst layer 40 and the amorphous silicon layer 60 having a predetermined thickness are formed on the substrate 1, by heat treating them, the amorphous silicon layer 60 is oriented and crystallized into the polycrystalline silicon layer 60', the efficient formation of the polycrystalline silicon layer can be performed on the basis of the formation of an amorphous silicon layer at the rapid rate, and therefore, a crystalline silicon semiconductor device of low cost can be provided.

Although the invention has been described with respect to specific embodiments for complete and clear disclosure, the appended claims are not to be thus limited but are to be construed as embodying all modification and alternative constructions that may occur to one skilled in the art which fairly fall within the basic teaching herein set forth.

What is claimed is:

1. A crystalline silicon semiconductor device, comprising:
   a substrate; and
   a polycrystalline silicon layer formed by heat treating an amorphous silicon layer provided on said substrate in the presence of a metallic catalyst;
   wherein said polycrystalline silicon layer is constituted of a polycrystalline silicon layer grown by heat treating said amorphous silicon layer that is formed on a concave and convex layer formed on said substrate, said metallic catalyst being positioned in the concave portion of said concave and convex layer.

2. A crystalline silicon semiconductor device according to claim 1, wherein said polycrystalline silicon layer has non-single crystalline silicon layers whose electrically conductive types are different.

3. A crystalline silicone semiconductor device according to claim 2, wherein said polycrystalline silicon layer is constituted of substantially intrinsic polycrystalline silicon.

4. A crystalline silicon semiconductor device according to claim 1, wherein said polycrystalline silicon layer has a thickness of equal to or more than 0.6 μm.

5. A crystalline silicon semiconductor device, comprising:
   a substrate; and
   a polycrystalline silicon layer formed by heat treating an amorphous silicon layer provided on said substrate in the presence of a metallic catalyst,
   wherein said polycrystalline silicon layer is constituted of a polycrystalline silicon layer grown by heat treating said amorphous silicon layer that is formed on a film of said metallic catalyst formed on said substrate, another film being formed on said metallic catalyst film, said another film having a pinhole such that said metallic catalyst is exposed through the pinhole.

6. A crystalline silicon semiconductor device according to claim 5, wherein said polycrystalline silicon layer has non-single crystalline silicon layers whose electrically conductive types are different.

7. A crystalline silicon semiconductor device according to claim 6, wherein said polycrystalline silicon layer is constituted of substantially intrinsic polycrystalline silicon.

8. A crystalline silicon semiconductor device according to claim 5, wherein said polycrystalline silicon layer has a thickness of equal to or more than 0.6 μm.

9. A structure for forming a crystalline silicon semiconductor device, comprising:
   a substrate;
   an amorphous silicon layer provided on the substrate;
   a metallic catalyst formed on the substrate; and
   one of (i) a concave and convex layer formed on the substrate, with the metallic catalyst positioned between the concave and convex layer and the amorphous silicon layer and in a concave portion of the concave and convex layer, and (ii) a film formed on the substrate between the metallic catalyst and the amorphous silicon layer, and having a pinhole exposing the metallic catalyst to the amorphous silicon layer.

* * * * *